US012757747B2

(12) United States Patent
Toba et al.

(10) Patent No.: US 12,757,747 B2
(45) Date of Patent: Oct. 6, 2026

(54) METHOD FOR MANUFACTURING WIRING BOARD, METHOD FOR MANUFACTURING SEMICONDUCTOR DEVICE, AND RESIN SHEET

(71) Applicant: Resonac Corporation, Minato-ku (JP)

(72) Inventors: Masaya Toba, Minato-ku (JP); Kazuyuki Mitsukura, Minato-ku (JP); Masaki Yamaguchi, Minato-ku (JP)

( * ) Notice: Subject to any disclaimer, the term of this patent is extended or adjusted under 35 U.S.C. 154(b) by 720 days.

(21) Appl. No.: 18/247,077

(22) PCT Filed: Sep. 29, 2021

(86) PCT No.: PCT/JP2021/035957
§ 371 (c)(1),
(2) Date: Mar. 29, 2023

(87) PCT Pub. No.: WO2022/071430
PCT Pub. Date: Apr. 7, 2022

(65) Prior Publication Data
US 2024/0030044 A1 Jan. 25, 2024

(30) Foreign Application Priority Data
Oct. 1, 2020 (WO) .................. PCT/JP2020/037450

(51) Int. Cl.
*H10W 70/05* (2026.01)
*H10W 70/65* (2026.01)
*H10W 70/685* (2026.01)

(52) U.S. Cl.
CPC ........... *H10W 70/05* (2026.01); *H10W 70/65* (2026.01); *H10W 70/685* (2026.01)

(58) Field of Classification Search
None
See application file for complete search history.

(56) References Cited

U.S. PATENT DOCUMENTS

2007/0095471 A1* 5/2007 Ito ....................... H01L 23/5385 257/E25.023
2009/0100673 A1* 4/2009 Yukiiri .................. H05K 3/421 29/830

(Continued)

FOREIGN PATENT DOCUMENTS

JP H9-036522 2/1997
JP 2009-099649 5/2009

(Continued)

OTHER PUBLICATIONS

International Preliminary Report on Patentability with Written Opinion dated Apr. 13, 2023 for PCT/JP2020/037450.

(Continued)

*Primary Examiner* — Alexander G Ghyka
(74) *Attorney, Agent, or Firm* — SHIPWAY IP

(57) ABSTRACT

A method for manufacturing a wiring board includes preparing a structure body in which a resin sheet having a glass cloth arranged in an organic resin is attached onto a support body having a metal layer provided on a surface thereof or onto a built-in wiring layer provided on the support body, forming a recess by excimer laser in a first resin layer region in which the glass cloth does not exist on a surface side of the resin sheet, forming an opening portion reaching the metal layer on the support body from the surface of the resin sheet, and forming a wiring layer in the recess and the opening portion.

19 Claims, 4 Drawing Sheets

(56) References Cited

U.S. PATENT DOCUMENTS

| | | | | |
|---|---|---|---|---|
| 2011/0221071 | A1 | 9/2011 | Motohashi et al. | |
| 2011/0279996 | A1* | 11/2011 | Tomura | H05K 1/0271 174/250 |
| 2014/0015121 | A1* | 1/2014 | Koizumi | H01L 21/486 257/734 |

FOREIGN PATENT DOCUMENTS

| | | |
|---|---|---|
| JP | 2011-100796 | 5/2011 |
| JP | 2012-028511 | 2/2012 |
| JP | 2012-146784 | 8/2012 |
| JP | 2012-529770 | 11/2012 |
| KR | 20090038375 | 4/2009 |
| KR | 20110139105 X | 12/2011 |
| KR | 20130028861 | 3/2013 |
| WO | 2009/119680 | 10/2009 |

OTHER PUBLICATIONS

International Preliminary Report on Patentability with Written Opinion dated Apr. 13, 2023 for PCT/JP2021/035957.

Jinseong Kim et al., “Application of Through Mold Via (TMV) as PoP Base Package”, IEEE, Electronic Components and Technology Conference (ECTC), 2008.

S.Yoon et al., “Advanced Low Profile POP Solution with Embedded Wafer Level POP (eWLB-PoP) Technology”, EEE, Electronic Components and Technology Conference(ECTC), 2012.

International Search Report dated Dec. 22, 2020 for PCT/JP2020/037450.

International Search Report dated Dec. 14, 2021 for PCT/JP2021/035957.

* cited by examiner (a)

(b)

(c)

(a)

(b)

METHOD FOR MANUFACTURING WIRING BOARD, METHOD FOR MANUFACTURING SEMICONDUCTOR DEVICE, AND RESIN SHEET

CROSS-REFERENCE TO RELATED APPLICATIONS

This application is a 35 U.S.C. § 371 national phase application of PCT/JP2021/035957, filed on Sep. 29, 2021, which claims priority to International Patent Application No. PCT/JP2020/037450, filed on Oct. 1, 2020.

TECHNICAL FIELD

The present invention relates to a method for manufacturing a wiring board, a method for manufacturing a semiconductor device, and a resin sheet. More specifically, the present invention relates to a manufacturing method for efficiently manufacturing a wiring board and a semiconductor device at a low cost, in which there is a high demand for fining or densification.

BACKGROUND ART

In order to increase the density and the performance of a semiconductor package, a mounting form is proposed in which chips with different performance are mixed in one package, and a cost-efficient and high-density interchip interconnect technology becomes important (for example, refer to Patent Literature 1).

A package-on-package for connecting different packages by laminating the packages on a package with flip chip mounting has been widely adopted in a smartphone and a tablet terminal (for example, refer to Non Patent Literature 1 and Non Patent Literature 2). Further, as a high-density mounting form, a package technology using an organic board including high-density wiring (an organic interposer), a fan-out package technology (FO-WLP) including a through mold via (TMV), a package technology using a silicon or glass interposer, a package technology using a through-silicon via (TSV), a package technology using a chip embedded in a board for interchip transmission, and the like have been proposed.

In particular, in the organic interposer or the FO-WLP, in a case where the semiconductor chips are mounted in parallel, a fine wiring layer is required for high-density conduction (for example, refer to Patent Literature 2).

CITATION LIST

Patent Literature

Patent Literature 1: Japanese Unexamined Patent Publication No. 2012-529770

Patent Literature 2: U.S. Patent Application Publication No. 2001/0221071

Non Patent Literature

Non Patent Literature 1: Application of Through Mold Via (TMV) as PoP Base Package, Electronic Components and Technology Conference (ECTC), 2008

Non Patent Literature 2: Advanced Low Profile PoP Solution with Embedded Wafer Level PoP (eWLB-PoP) Technology, ECTC, 2012

SUMMARY OF INVENTION

Technical Problem

In the formation of the fine wiring layer described above, forming a seed layer by sputtering, forming a resist, performing electroplating, removing the resist, and removing the seed layer are required, which makes a manufacturing process complicated. Thus, a more simplified method for forming a fine wiring layer is desired.

Therefore, an object of the present invention is to provide a simplified method for forming a fine wiring layer.

Solution to Problem

As one aspect, the present invention relates to a method for manufacturing a wiring board. This method for manufacturing a wiring board includes preparing a structure body in which a resin sheet having a glass cloth arranged in an organic resin is attached onto a support body having a metal layer provided on a surface thereof or onto a built-in wiring layer provided on the support body, forming a recess by excimer laser in a first resin layer region in which the glass cloth does not exist on a surface side of the resin sheet; forming an opening portion reaching the metal layer on the support body from the surface of the resin sheet; and forming a wiring layer in the recess and the opening portion.

In this method for manufacturing a wiring board, the resin sheet having the glass cloth arranged in the organic resin is used, the recess is formed by the excimer laser in the first resin layer region in which the glass cloth does not exist in the resin sheet, and the wiring layer is formed in the recess and the like. In this case, fine processing of the recess can be performed by the excimer laser, and a fine wiring layer can be easily formed. In this manufacturing method, either the forming of the recess or the forming of the opening portion may be performed first, or both of the steps may be performed simultaneously. In addition, in this manufacturing method, a plating treatment may be used or other methods may be used for the forming of the wiring layer in the recess and the opening portion.

As another aspect, the present invention relates to another method for manufacturing a wiring board. This method for manufacturing a wiring board includes preparing a structure body in which a resin sheet sequentially including a first resin layer region positioned outside and a high elasticity layer region positioned inside with an elastic modulus higher than that of the first resin layer region is attached onto a support body having a metal layer provided on a surface thereof or a built-in wiring layer provided on the support body, forming a recess by laser or imprinting in the first resin layer region on a surface side of the resin sheet, forming an opening portion reaching the metal layer on the support body from the surface of the resin sheet, and forming a wiring layer in the recess and the opening portion.

In this method for manufacturing a wiring board, the resin sheet including the first resin layer region positioned outside and the high elasticity layer region is used, the recess is formed by the laser or the imprinting in the first resin layer region in the resin sheet, and the wiring layer is formed in the recess and the like. In this case, fine processing of the recess can be performed by the laser or the imprinting, and a fine wiring layer can be easily formed. In this manufacturing method, either the forming of the recess or the forming of the opening portion may be performed first, or both of the steps may be performed simultaneously. In addition, in this manufacturing method, a plating treatment may be used or other methods may be used for the forming of the wiring layer in the recess and the opening portion. In addition, in this manufacturing method, the high elasticity layer region may be formed by arranging at least one of an inorganic fiber and an organic fiber in an organic resin material. The inorganic fiber may be at least one of a glass fiber, a ceramic fiber, and a carbon fiber, and the organic fiber may be at least one of an aramid fiber and a polyethylene fiber.

In any one of the methods for manufacturing a wiring board described above, a thickness of the first resin layer region on the surface side of the resin sheet may be 20 μm or less. In this case, a layer region for forming the fine wiring layer can be thinned, and the height of a wiring board to be manufactured can be reduced. In this case, the thickness of the first resin layer region may be 5 μm or more. Accordingly, a recess with a suitable depth can be formed, and the fine wiring layer excellent in conductivity can be formed.

In any one of the methods for manufacturing a wiring board described above, a line width of the recess formed in the first resin layer region may be 0.5 μm or more and 5 μm or less. In this case, the fine wiring layer excellent in the conductivity can be formed.

In any one of the methods for manufacturing a wiring board described above, the resin sheet may include a second resin layer region opposite to the first resin layer region, and in the preparing of the structure body, the structure body may be prepared by sticking the resin sheet onto the support body or onto the built-in wiring layer with the second resin layer region. In this case, the structure body can be prepared by a simple method such as lamination, and the manufacturing method can be simplified. In the preparing of the structure body, the structure body in which the resin sheet is attached in advance onto the support body or onto the built-in wiring layer may be prepared to be used in the subsequent step.

In any one of the methods for manufacturing a wiring board described above, when the recess is formed by the excimer laser in the first resin layer region, a pulse width of the excimer laser may be 10 nanoseconds or longer and 50 nanoseconds or shorter, and output of the excimer laser may be 10 mJ/pulse or more and 1000 mJ/pulse or less. In this case, a finer recess can be easily formed.

In any one of the methods for manufacturing a wiring board described above, in the forming of the wiring layer, the wiring layer may be formed by forming a plated metal layer in the recess and the opening portion, and the resin sheet may contain a component having a heterocyclic aromatic nucleus capable of performing a coordinate bond with respect to a metal material configuring a seed layer for forming the plated metal layer. In this case, the finer wiring layer is easily formed. The component having a heterocyclic aromatic nucleus capable of performing the coordinate bond with respect to the metal material configuring the seed layer, for example, may be at least one compound selected from the group consisting of a maleimide compound, a bismaleimide compound, a triazole compound, a benzotriazole compound, and a benzooxazole compound.

In any one of the methods for manufacturing a wiring board described above, the resin sheet or a covering layer covering the resin sheet may contain a laser light absorptive coloring component including at least one of an inorganic colorant, an inorganic pigment, an organic colorant, and an organic pigment. In this case, the processing of the recess can be more accurately performed by the laser. The laser light absorptive coloring component, for example, may be at least one of black lead, graphene, a carbon nanotube, a carbon fiber, carbon black, phthalocyanine, cyanine, an alkaline-earth metal, and a metal complex.

In any one of the methods for manufacturing a wiring board described above, in the forming of the wiring layer, the wiring layer may be formed by providing the seed layer in the recess and the opening portion with electroless plating to form the plated metal layer. The resin sheet may contain a catalyst for forming the electroless plating. In this case, the finer wiring layer is easily formed. The catalyst for forming the electroless plating may be at least one of palladium particles, a palladium complex, copper particles, and a copper complex.

In any one of the methods for manufacturing a wiring board described above, the forming of the wiring layer may include filling the recess and the opening portion with a conductive material and of providing the conductive material on a surface of the first resin layer region excluding the recess and the opening portion to form a conductive layer, and planarizing the conductive layer. In the planarizing of the conductive layer, a first portion of the conductive layer provided on the surface of the first resin layer region may at least be polished, and the wiring layer may be formed from a second portion of the conductive layer formed from the conductive material filled in the recess and the opening portion. In this case, the fine wiring layer can be more efficiently formed.

Any one of the methods for manufacturing a wiring board described above may further include forming a built-in wiring portion including at least one built-in wiring layer on the support body, and in the preparing of the structure body, the structure body may be prepared by sticking the resin sheet onto the built-in wiring portion to be attached. In this case, for example, the wiring board having an optimum layer configuration can be fabricated by using different materials such that the built-in wiring layer is formed from a buildup material and the fine wiring layer on the surface is formed from an organic resin material such as a prepreg. In addition, the degree of freedom in design of the wiring board can be increased.

Any one of the methods for manufacturing a wiring board described above, may further include attaching another resin sheet onto the resin sheet on which the wiring layer is formed, forming another recess by the laser in a first resin layer region of the another resin sheet; forming another opening portion reaching the plated metal layer or the wiring layer in the opening portion from a surface of the another resin sheet, and forming another plated metal layer in the another recess and the another opening portion to form another wiring layer. The attaching of the another resin sheet, the forming of the another recess, the forming of the another opening portion, and the forming of the another wiring layer are repeated at least once or more. In this case, the method for manufacturing a wiring board including two or more fine wiring layers can be simplified.

In any one of the methods for manufacturing a wiring board described above, the forming of the wiring layer may include performing a desmear treatment with respect to at least the opening portion and the recess, performing the electroless plating with respect to at least the opening portion and the recess to form the seed layer, performing electrolytic plating on the seed layer to form the plated metal layer, and removing the seed layer and the plated metal layer on the surface of the first resin layer region to planarize the surface of the first resin layer region, the seed layer, and the plated metal layer. In this case, a conductive portion of the fine wiring layer can be more accurately formed.

As still another aspect, the present invention relates to a method for manufacturing a semiconductor device. The method for manufacturing a semiconductor device includes preparing a wiring board manufactured by any one of the methods for manufacturing a wiring board described above, and mounting a semiconductor element on the wiring layer or the another wiring layer to electrically connect the semiconductor element to the wiring layer or the another wiring layer. In this case, a semiconductor device including a wiring board provided with a fine wiring layer can be fabricated by a simplified method. In addition, since the semiconductor device is fabricated by the simplified method, improvement in a manufacturing yield ratio, a cost reduction in manufactured goods, or the like can be attained. Further, the present invention is not limited thereto, and in a case where a plurality of semiconductor elements (chips) are mounted (in particular, in a case where a plurality of semiconductor elements (chips) are mounted with a high density), the semiconductor elements can be connected by the fine wiring layer excellent in transmission properties, and a small semiconductor device with more excellent performance can be provided.

As further still another aspect, the present invention relates to a resin sheet. The resin sheet used in any one of the methods for manufacturing a wiring board described above, includes a first resin layer region positioned outside, and a high elasticity layer region positioned inside with an elastic modulus higher than that of the first resin layer region or a high elasticity layer region positioned inside with a glass cloth. By providing such a resin sheet in advance, the method for manufacturing a wiring board and the method for manufacturing a semiconductor device described above can be further simplified, the improvement in the yield ratio of the wiring board and the semiconductor device to be manufactured, the cost reduction in the manufactured goods, or the like can be attained.

The resin sheet described above may further include a second resin layer region positioned opposite to the first resin layer region through the high elasticity layer region, and the second resin layer region may have adhesiveness. In this case, the structure body including the resin sheet can be more easily formed, and the method for manufacturing a wiring board and the method for manufacturing a semiconductor device described above can be further simplified.

Advantageous Effects of Invention

According to the present invention, it is possible to provide the simplified method for manufacturing the wiring board and the semiconductor device including the fine wiring layer.

DESCRIPTION OF EMBODIMENTS

Figure 1:
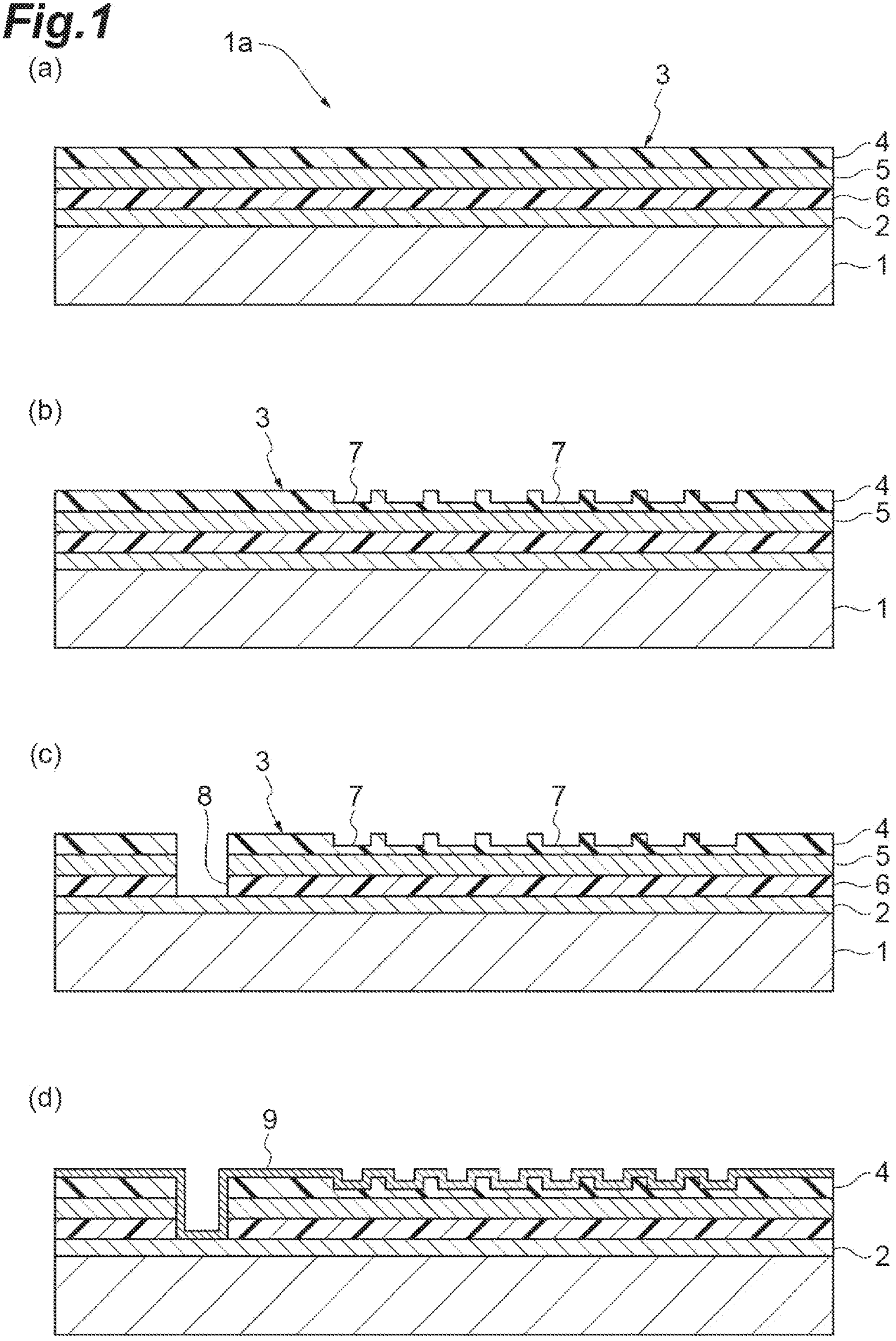
FIGS. 1(*a*) to 1(*d*) are diagrams illustrating a part of a method for manufacturing a wiring board according to one embodiment of the present invention.

Hereinafter, an embodiment according to the present invention will be described in detail, with reference to the drawings. In the following description, the same reference numerals will be applied to the same or corresponding parts, and the repeated description will be omitted. A positional relationship such as the left, right, top, and bottom is based on a positional relationship illustrated in the drawings, unless otherwise specified. Further, a dimension ratio in the drawings is not limited to the illustrated ratio.

In a case where terms such as "left", "right", "front", "back", "up", "down", "upper", and "lower" are used in the description of this specification and the claims, such terms are intended for description and do not necessarily indicate that such a relative position is permanent. The term "layer" includes not only a structure in which a layer is formed on the entire surface but also a structure in which a layer is formed on a part of the surface when observed as a plan view. The term "step" in this specification includes not only an independent step but also a step that is not explicitly distinguishable from other steps insofar as a desired function of the step is attained. A numerical range represented by using "to" indicates a range including numerical values described before and after "to" as the minimum value and the maximum value, respectively.

A method for manufacturing a wiring board and a method for manufacturing a semiconductor device according to one embodiment of the present invention will be described. It is preferable that the method for manufacturing a wiring board and the method for manufacturing a semiconductor device according to this embodiment are applied to a form in which fining and high-pin-count are required, but the present invention is not limited thereto. In addition, it is preferable that the manufacturing method according to this embodiment is applied to a package form in which an interposer for mixing different types of chips is required, but the present invention is not limited thereto. Hereinafter, for ease of description, a case in which one semiconductor element is mounted will be described, but the same applies to a form in which two or more (or two or more types of) semiconductor elements are mounted.

<Step of Preparing Structure Body>

Figure 2:
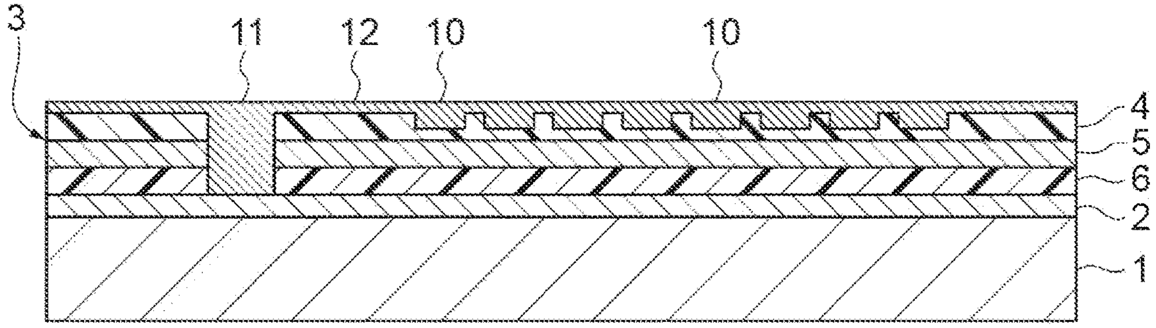
FIGS. 2(*a*) to 2(*c*) are diagrams illustrating a part of the method for manufacturing a wiring board according to one embodiment of the present invention, and are diagrams illustrating steps continuously performed subsequent to the step of FIG. 1.
Figure 2:
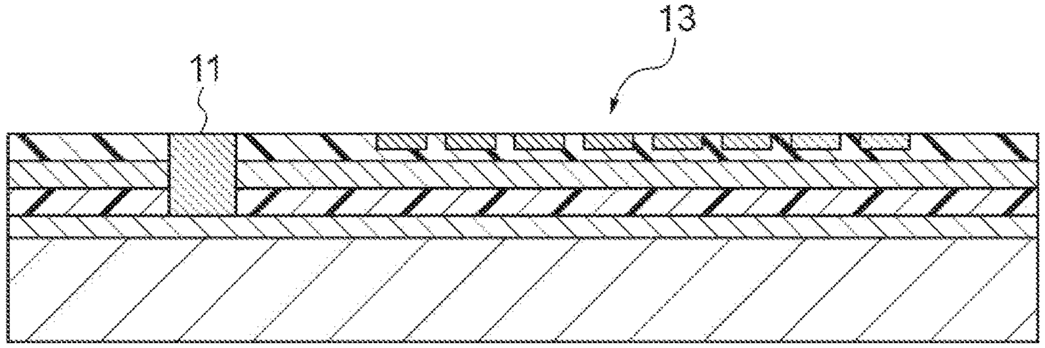
Figure 2:
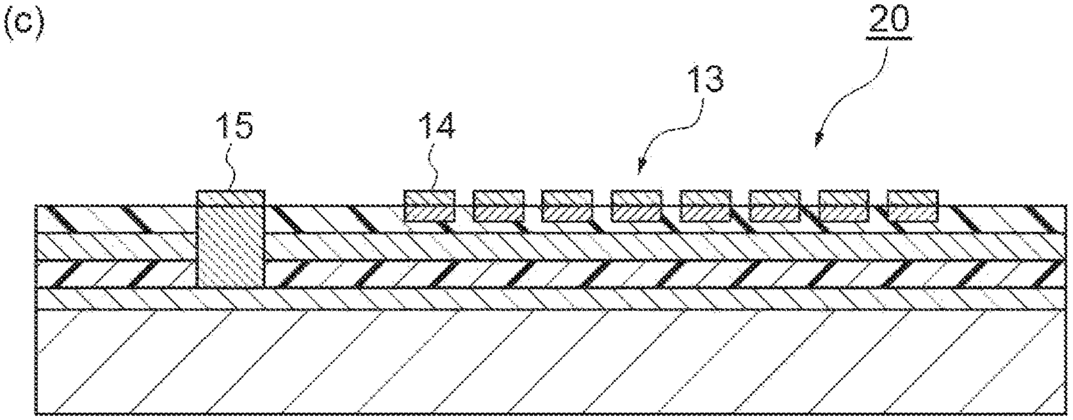

FIG. 1 and FIG. 2 are diagrams illustrating a method for manufacturing a wiring board according to this embodiment. As illustrated in FIG. 1(*a*), first, a structure body 1*a* is prepared in which a resin sheet 3 is attached onto a support body 1 having a copper layer 2 (metal layer) provided on the surface. The resin sheet 3, for example, is a sheet in which an organic resin is impregnated in a glass cloth, and includes a first resin layer region 4 in which a glass sheet does not exist on the surface side, a high elasticity layer region 5 positioned inside the first resin layer region 4, and a second resin layer region 6 positioned opposite to the first resin layer region 4 through the high elasticity layer region 5 (glass cloth). The resin sheet 3, for example, may have a configuration in which a highly elastic body such as the glass cloth is arranged in the organic resin, or a configuration in which both surfaces of the glass cloth are laminated with the resin sheets. The second resin layer region 6, for example, has adhesiveness, and the resin sheet 3 is stuck the copper layer 2 of the support body 1 through the second resin layer region 6 to be attached. In the preparing of the structure body 1*a*, the resin sheet 3 may be stuck to the copper layer 2 on the support body 1, or the structure body 1*a* in which resin sheet 3 may be attached in advance onto the support body 1 through the copper layer 2 may be prepared to be used.

The support body 1 is not particularly limited, and for example, is a silicon plate, a glass plate, a SUS plate, a board with a glass cloth, a sealing resin board with a semiconductor element, or the like, and is a board with high rigidity. The thickness of the support body 1 may be 0.2 mm or more and 2.0 mm or less. By setting the thickness of the support body 1 to 0.2 mm or more, it is possible to improve handleability, and by setting the thickness of the support body 1 to 2.0 mm or less, it is easy to reduce the height of the wiring board, and it is possible to reduce a material cost and to attain a cost reduction. In addition, the support body 1 may be in the form of a wafer or a panel, and the size of the support body 1 is not particularly limited. The support body 1 may be a wafer with a diameter of 200 mm, a diameter of 300 mm, or a diameter of 450 mm, or a rectangular panel with one side of 300 mm or more and 700 mm or less.

The resin sheet 3, for example, is a semi-cured film-shaped member such as a prepreg. An organic resin material contained in the resin sheet 3 may include at least one of a thermosetting material and a thermoplastic material in order to ensure electrical insulating properties. The thermosetting material used herein, for example, is an epoxy resin, and the thermoplastic resin, for example, is an acrylic resin, but the present invention is not limited thereto. The organic resin material contained in the resin sheet 3 may be a film-shaped composite body from the viewpoint of film thickness flatness and a cost. In addition, the organic resin material may include the thermosetting material from the viewpoint that a fine recess can be formed. A size of a filler (filling material) contained in the thermosetting material may be an average particle diameter of 500 nm or less. The thermosetting material may not contain the filler. The first resin layer region 4 and the second resin layer region 6 of the resin sheet 3 contain such an organic resin material to be a region in which the glass cloth does not exist. In forming a recess described below, the film thickness of the first resin layer region 4 may be 20 μm or less, or 10 μm or less, in order to form a fine trench structure. The film thickness of the first resin layer region 4 may be 5 μm or more in order to ensure conductivity in a fine wiring structure.

The glass cloth contained in the resin sheet 3 includes a woven cloth or a non-woven cloth containing glass fibers. The glass fibers, for example, may be E glass, S glass, or quartz glass. The thickness of the glass cloth, for example, may be 0.01 μm or more and 0.2 μm or less. By impregnating such a glass cloth in the organic resin material described above, the high elasticity layer region 5 is configured. That is, the high elasticity layer region 5 contains the glass cloth, and the organic resin material impregnated or infiltrated into the glass cloth. The high elasticity layer region 5 contains a rigid material such as glass, thereby having an elastic modulus, specifically, a Young's modulus higher than that of the first resin layer region 4 and the second resin layer region 6. Instead of the glass fiber, at least one of other inorganic fibers and organic fibers may be impregnated in the organic resin material to form the high elasticity layer region 5. The inorganic fiber, for example, is a ceramic fiber, a carbon fiber, or the like, and the organic fiber, for example, is an aramid fiber or a polyethylene fiber.

The organic resin material contained in the resin sheet 3, for example, may contain a component having a heterocyclic aromatic nucleus capable of performing a coordinate bond with a metal, such as a maleimide compound, a bismaleimide compound, a triazole compound, a benzotriazole compound, and a benzooxazole compound, in order to increase adherence with a seed layer to be formed in the subsequent step. Here, the metal is a metal material configuring the seed layer. This component may be contained in a filler surface treatment agent. In the case of forming the seed layer described below with electroless plating, the resin sheet 3 may contain palladium particles, a palladium complex, copper particles, and a copper complex that are a catalyst in the electroless plating.

The resin sheet 3 may contain a laser light absorptive coloring component including an inorganic colorant or an inorganic pigment such as black lead, graphene, a carbon nanotube, a carbon fiber, and carbon black, or an organic colorant or an organic pigment such as phthalocyanine series, cyanine series, an alkaline-earth metal salt, and a metal complex, in order to improve absorptivity with respect to laser light. This component may be contained in the filler surface treatment agent.

The resin sheet 3 has the configuration described above, and for example, the thickness thereof may be 10 μm or more and 100 μm or less. By setting the thickness of the resin sheet 3 to 10 μm or more, it is possible to improve the handleability. In addition, by setting the thickness of the resin sheet 3 to 100 μm or less, it is possible to form the wiring board or the semiconductor device to be manufactured into a thin package.

The resin sheet 3, for example, may be formed to have a structure including the first resin layer region 4, the high elasticity layer region 5, and the second resin layer region 6 by impregnating the glass cloth in the organic resin (varnish), or may be formed by arranging the glass cloth between a resin layer corresponding to the first resin layer region 4 and a resin layer corresponding to the second resin layer region 6, and by performing lamination or press. As a method for forming the resin sheet 3, such as lamination, vacuum lamination, roll lamination, vacuum roll lamination, atmospheric-pressure press, vacuum press, or the like can be used. In the case of using the vacuum press, the oxidation of the thermosetting material contained in the resin sheet 3 can be easily suppressed, and the film thickness flatness can be further improved. In addition, a temperature when forming the resin sheet 3 may be a temperature at which the thermosetting material contained in the resin sheet 3 is thermally cured, and for example, may be 100° C. or higher and 250° C. or lower. By setting the formation temperature to 100° C. or higher, it is possible to weaken the tackiness of the organic resin material of the resin sheet 3 and to improve the handleability. By setting the formation temperature to 250° C. or lower, it is possible to suppress the warpage of the resin sheet 3.

As such a resin sheet 3, for example, "MCL-E-705G, a thickness of 0.4 mm or 0.6 mm, 255 mm square (manufactured by Hitachi Chemical Company, Ltd.)", "R-1766, a thickness of 0.4 mm or 0.6 mm, 255 mm square", "R-5715ES, a thickness of 0.4 mm or 0.6 mm, 255 mm square", and "R-5670Kj, a thickness of 0.4 mm or 0.6 mm, 255 mm square (all are manufactured by Panasonic Corporation)", or "GHPL830NS, a thickness of 0.4 mm or 0.6 mm, 255 mm square", "830NS, a thickness of 0.4 mm or 0.6 mm, 255 mm square", and "830NSF, a thickness of 0.4 mm or 0.6 mm, 255 mm square (all are manufactured by MITSUBISHI GAS CHEMICAL COMPANY, INC.)" can be used.

A covering layer can be provided on the surface of the resin sheet 3 (on a side where the recess is formed). The covering layer, for example, may be an organic resin film including a polyethylene terephthalate (PET) resin, a polyethylene naphthalate (PEN) resin, a polyether ether ketone (PEEK) resin, a polyimide (PI) resin, and the like, or a metal foil such as a Cu foil, a Ni foil, and a SUS foil. In order to improve the absorption of laser light, the organic resin film configuring the covering layer may contain a laser light absorptive coloring component including an inorganic colorant or an inorganic pigment such as black lead, graphene, a carbon nanotube, a carbon fiber, and carbon black, or an organic colorant or an organic pigment such as phthalocyanine series, cyanine series, an alkaline-earth metal salt, and a metal complex. In addition, the surface of the metal foil may be subjected to a tanning treatment.

<Step of Forming Recess>

Next, in a case where the preparing of the structure body 1*a* is ended, as illustrated in FIG. 1(*b*), a plurality of recesses 7 are formed by excimer laser in the first resin layer region 4 in which the glass cloth does not exist on the surface side of the resin sheet 3. The recess 7 indicates a part recessed in a thickness direction of the first resin layer region 4 with respect to the surface of the first resin layer region 4, and includes the inner wall (side walls, bottom wall, or the like) of this recessed part. The recess 7 is formed as a groove extending in an illustrated perpendicular direction or the like, with a width along an illustrated horizontal direction, and has a shape corresponding to fine wiring in a planar direction. In order to form the recess in the first resin layer region 4 containing the thermosetting material or the thermoplastic material, processing may be performed by using the excimer laser from the viewpoint of the fining, and processing using carbon dioxide laser or UV-YAG laser, or imprinting may be used.

In the forming of the recess, the recess 7 may be formed such that an opening width is 0.5 μm or more and 20 μm or less, and the recess 7 may be formed such that the opening width is 0.5 μm or more and 5 μm or less from the viewpoint of the fining. Accordingly, a fine wiring layer can be formed to provide a highly densified semiconductor device. In order to form such a recess with a fine opening width, as described above, the excimer laser may be used. A medium for the excimer laser to be used is argon/fluorine (ArF) or krypton/fluorine (KrF), and excimer laser using KrF as a medium may be used from the viewpoint of general versatility. In addition, as a processing condition of the excimer laser, pulse energy may be 20 mJ or more and 100 mJ or less. A pulse repetition frequency may be 1 Hz or more and 4000 Hz or less. A pulse width may be 10 nanoseconds or longer and 50 nanoseconds or shorter. A laser irradiance level may be greater than 0 and 1000 $mJ/cm^2$ or less. The output of the excimer laser may be 10 mJ/pulse or more and 1000 mJ/pulse or less.

In the forming of the recess, the resin sheet 3 including the first resin layer region 4 may be further heated and cured after the recesses 7 are formed. In this case, a heating temperature may be 100° C. or higher and 250° C. or lower, and a heating time may be 30 minutes or longer and 3 hours or shorter. The recesses 7 are configured not to reach the high elasticity layer region 5.

<Step of Forming Opening Portion>

Next, in a case where the formation of the recesses 7 is ended, as illustrated in FIG. 1(*c*), an opening portion 8 reaching the copper layer 2 of the support body 1 from the surface of the resin sheet 3 is formed. In the forming of the opening portion, the opening portion 8 is formed in the resin sheet 3 to penetrate through the high elasticity layer region 5 containing the glass cloth, and the first resin layer region 4 and the second resin layer region 6 containing the organic resin material, as a whole. As a method for forming the opening portion 8, for example, carbon dioxide laser processing or drill processing can be used, and carbon dioxide laser may be used from the viewpoint of the fining.

In the forming of the opening portion, for example, the opening portion 8 with an opening diameter of 30 μm or more and 200 μm or less is formed. According to the opening portion 8 with such a size, it is possible to provide the semiconductor device in which densification is attained, and it is possible to manufacture the semiconductor device including the fine wiring layer at an excellent yield ratio and a low cost. The forming of the opening portion may be performed before the forming of the recesses described above, may be performed after the forming of the recesses described above, or both of the steps may be performed simultaneously, and the order is not particularly limited.

<Step of Performing Desmear>

Next, in a case where the formation of the recesses 7 and the opening portion 8 is ended, desmear is performed in order to remove a smear formed by laser opening. As a desmear liquid, a commercially available pretreatment liquid and a commercially available desmear liquid may be used. As the pretreatment liquid, for example, a swelling liquid (Product Name: Swelling Dip Securiganth, manufactured by Atotech Japan Co., Ltd.) can be used. As the desmear liquid, for example, a roughening liquid (Product Name: Concentrate Compact CP, manufactured by Atotech Japan Co., Ltd.) can be used. As a chemical used for neutralization after the desmear, for example, a neutralization liquid (Product Name: Reduction Securiganth, manufactured by Atotech Japan Co., Ltd.) can be used.

As a swelling condition in a desmear treatment, the temperature of the swelling liquid may be 50° C. or higher and 80° C. or lower, and an immersion time may be 1 minute or longer and 30 minutes or shorter. After a swelling treatment, the recesses 7, the opening portion 8, and the like may be washed with pure water or clean water. In addition, after the swelling treatment, a roughening treatment is performed with the desmear liquid. As a desmear condition, the temperature of the desmear liquid may be 30° C. or higher and 80° C. or lower, and an immersion time may be 1 minute or longer and 30 minutes or shorter. After the desmear treatment, washing may be performed with pure water or clean water. After the roughening with the desmear liquid, drag-out is performed with pure water or clean water. A drag-out temperature may be 25° C. or higher and 50° C. or lower, and an immersion time may be 1 minute or longer and 5 minutes or shorter. After the drag-out, neutralization is performed. A neutralization temperature may be 25° C. or higher and 50° C. or lower, and an immersion time may be 1 minute or longer and 10 minutes or shorter. After a neutralization treatment, washing may be performed with pure water or clean water. As described above, the desmear treatment is ended.

<Step of Forming Seed Layer>

In a case where the desmear treatment is ended, as illustrated in FIG. 1(*d*), forming a seed layer 9 on the surface of the first resin layer region 4, the side walls and the bottom walls of the recesses 7, the side wall of the opening portion 8, and the surface of the copper layer 2 exposed to the opening portion 8 is performed. In the forming of the seed layer, the seed layer 9 can be formed by using a method using a copper paste, a sputtering method, or an electroless plating method. As a method suitable for panelization, the electroless plating method can be used.

In order to form the seed layer 9, first, the surface of the first resin layer region 4, the side walls and the bottom walls of the recesses 7, the side wall of the opening portion 8, the surface of the copper layer 2 exposed to the opening portion 8 (hereinafter, also referred to as the "surface of the first resin layer region 4, and the like") are washed with the pretreatment liquid to adsorb palladium that is a catalyst of electroless copper plating in the surface of the first resin layer region 4, and the like. The pretreatment liquid, for example, is a commercially available alkaline pretreatment liquid containing sodium hydroxide or potassium hydroxide. The pretreatment may be performed at the concentration of the sodium hydroxide or the potassium hydroxide of 1% or more and 30% or less, may be performed for an immersion time in the pretreatment liquid of 1 minute or longer and 60 minutes or shorter, or may be performed at an immersion temperature in the pretreatment liquid of 25° C. or higher and 80° C. or lower. After the pretreatment, in order to remove the excess pretreatment liquid, washing may be performed with clean water, pure water, ultrapure water, or an organic solvent.

After the pretreatment liquid is removed, immersion washing is performed with an acidic aqueous solution in order to remove alkali ions from the surface of the first resin layer region 4, and the like. The immersion washing may be performed by using an aqueous solution of a sulfuric acid as the acidic aqueous solution, or may be performed at a concentration of 1% or more and 20% or less for an immersion time of 1 minute or longer and 60 minutes or shorter. In order to remove the acidic aqueous solution, washing may be performed with clean water, pure water, ultrapure water, or an organic solvent. After that, palladium is attached to the first resin layer region 4 and the like after being subjected to the immersion washing with the acidic aqueous solution. In the attachment of the palladium, a commercially available palladium-tin colloidal solution, an aqueous solution containing palladium ions, a palladium ion suspension liquid, or the like may be used, and the aqueous solution containing the palladium ions effectively adsorbed in a modifying layer may be used. Immersion in the aqueous solution containing the palladium ions may be performed at the temperature of the aqueous solution containing the palladium ions of 25° C. or higher and or lower for an immersion time for adsorption of 1 minute or longer and 60 minutes or shorter. After the palladium ions are adsorbed, washing may be performed with clean water, pure water, ultrapure water, or an organic solvent in order to remove the excess palladium ions.

Subsequently, after the palladium ions are adsorbed, activation for allowing the palladium ions to function as a catalyst is performed. As a reagent for activating the palladium ions, a commercially available activating agent (activating treatment liquid) may be used. The temperature of the activating agent immersed in order to activate the palladium ions may be 25° C. or higher and 80° C. or lower, and an immersion time for activation may be 1 minute or longer and 60 minutes or shorter. After the palladium ions are activated, washing may be performed with clean water, pure water, ultrapure water, or an organic solvent in order to remove the excess activating agent. After that, the seed layer 9 is formed by electroless plating with the palladium as a catalyst. The seed layer 9, for example, is an electroless plating layer selected from the group consisting of a copper layer, a nickel layer, a copper-nickel alloy layer, a nickel-phosphor alloy layer, and a copper-nickel-phosphor alloy layer. The material of the seed layer 9 may be the copper layer from the viewpoint of the cost.

In a case where the copper layer is formed as the seed layer 9, a commercially available plating liquid may be used as an electroless plating liquid, and for example, an electroless copper plating liquid (Product Name: Copper Solution Printoganth MSK, manufactured by Atotech Japan Co., Ltd.) can be used. The formation of the electroless copper plating is performed in the electroless copper plating liquid at or higher and 40° C. or lower. The thickness of the seed layer 9 may be 0.1 nm or more and 500 nm or less, 0.1 nm or more and 400 nm or less, or 0.1 nm or more and 300 nm or less. By setting the thickness of the seed layer 9 to 0.1 nm or more, in the subsequent electrolytic plating, it is easy to form wiring with a uniform thickness. On the other hand, by setting the thickness of the seed layer 9 to 500 nm or less, it is possible to prevent excessive etching with respect to the wiring in an etching step of the seed layer 9, and to form the fine wiring at an excellent yield ratio.

After the electroless plating is performed, washing may be performed with water or an organic solvent in order to remove the excess plating liquid. After the electroless plating, thermal curing (Annealing: an age-curing treatment by heating) may be performed in order to increase an adherence force between the seed layer 9 and the surface of the first resin layer region 4. Heating may be performed such that a thermal curing temperature is 80° C. or higher and 200° C. or lower. In order to further accelerate reactivity, heating may be performed such that the thermal curing temperature is 120° C. or higher and 200° C. or lower, or heating may be performed such that the thermal curing temperature is 120° C. or higher and 180° C. or lower, and a thermal curing time may be 5 minutes or longer and 60 minutes or shorter, 10 minutes or longer and 60 minutes or shorter, or 20 minutes or longer and 60 minutes or shorter.

<Step of Forming Copper Layer>

In a case where the forming of the seed layer is ended, as illustrated in FIG. 2(*a*), forming copper layers 10, 11, and 12 (plated metal layers or conductive layers) by the electrolytic copper plating (conductive material) on the seed layer 9 is performed. More specifically, the copper layer formed by the electroless copper plating is used as the seed layer 9, and the copper layers 10 to 12 are formed by the electrolytic copper plating on the seed layer. In this embodiment, as a method for forming the copper layers 10 to 12, the electrolytic copper plating is used, but other than the electrolytic copper plating, for example, the electroless plating may be used.

In the forming of the copper layer, the recesses 7 provided on the surface of the first resin layer region 4 are filled in with the copper layer 10 (second portion), the opening portion 8 provided to reach the copper layer 2 from the surface of the first resin layer region 4 is filled in with the copper layer 11 (second portion), and the copper layer 12 (first portion) is formed on the surface of the first resin layer region 4 excluding the recesses 7 and the opening portion 8. By filling in the recesses 7 with the copper layer 10, and by filling in the opening portion 8 with the copper layer 11, it is possible to planarize the copper layers 10 to 12 formed on the surface of the first resin layer region 4 and formed in the recesses 7 and the opening portion 8, respectively, only by removing the copper layer 12, the seed layer, and the palladium adsorption layer from the surface of the first resin layer region 4 excluding the recesses 7 and the opening portion 8 in the subsequent step, without grinding the surface of the first resin layer region 4. After the copper layer, the seed layer, and the palladium adsorption layer are removed, the surface of the first resin layer region 4 may be further grinded, and the surface of the first resin layer region 4, and the copper layers 10 and 11 formed in the recesses 7 and the opening portion 8, respectively, may be planarized.

In order to fill in the recesses 7 with the copper layer 10 or in the opening portion 8 with the copper layer 11 by the electrolytic copper plating, so-called filling plating may be used in which the deposition amount (plating thickness) of the electrolytic copper plating in the recesses 7 and the opening portion 8 is larger than that on the surface of the first resin layer region 4. The recesses 7 or the opening portion 8 may not be filled in with the copper layers 10 and 11, or the copper layers and 11 may be formed along the inner walls (bottom walls and side walls) of the recesses 7 or the opening portion 8. In this case, the copper layer 10 in the recesses 7 (bottom walls of recesses 7) and the copper layer 11 in the opening portion 8 are exposed by not only removing the copper layer 12, the seed layer, and the palladium adsorption layer from the surface of the first resin layer region 4 excluding the recesses 7 and the opening portion 8, but also further grinding the surface of the first resin layer region 4, and the surface of the first resin layer region 4 and the copper layers 10 to 12 in the recesses 7 and the opening portion 8 can be planarized.

<Step of Forming Wiring Layer>

Next, in a case where the forming the copper layer is ended, as illustrated in FIG. 2(*b*), by removing the copper layer 12, the seed layer, and the palladium catalyst from the surface of the first resin layer region 4 excluding the recesses 7 and the opening portion 8, forming a wiring layer 13 including the copper layer 10 formed in the recesses 7 and the copper layer 11 formed in the opening portion 8 is performed. That is, by removing the copper layer 12, the seed layer, and the palladium adsorption layer on the surface of the first resin layer region 4, the copper layers 10 and 11 (specifically, including the seed layer and the palladium adsorption layer corresponding to the copper layers 10 and 11) remains only in the recesses 7 and the opening portion 8 on the surface of the first resin layer region 4 including the recess 7 and the like, and the copper layers 10 and 11, and the like in the recesses 7 and the opening portion 8 form the wiring layer 13. The main parts of the wiring layer 13 include the copper layer 10 formed in the plurality of recesses 7. The wiring layer 13 is connected to a connection terminal of a semiconductor element 22 described below.

When the copper layer 12, the seed layer, and the palladium adsorption layer are removed from the surface of the first resin layer region 4 excluding the recesses 7, the surface of the first resin layer region 4 and the copper layer 10 formed in the recesses 7 may be planarized. In addition, when the copper layer 12, the seed layer, and the palladium adsorption layer above the first resin layer region 4 are removed, a part in the thickness direction may be removed from the upper (surface) side of the first resin layer region 4. As a method for removing the copper layer 12, the seed layer, the palladium adsorption layer, and the first resin layer region 4 above the first resin layer region 4, a back grinding method, a fly-cutting method, or chemical mechanical polishing (CMP) can be used. In addition, a plurality of removing methods may be used together. In the fly-cutting method, for example, a grinding device using a diamond bit is used. As a specific example, an automatic surface planer compatible with a wafer of 300 mm (Product Name: "DAS8930", manufactured by DISCO Inc.) can be used. It can be said that the removal of the metal layer and the palladium adsorption layer by the fly-cutting method is planarizing processing since the entire surface is uniformly polished from the upper side (surface side) of the first resin layer region 4, and the polished surface is planarized.

In the case of performing polishing by the chemical mechanical polishing (CMP), as a specific example, a CMP polishing apparatus compatible with a wafer of 300 mm (Product Name: "F-REX300X", Manufactured by Applied Materials, Inc.) can be used. In the case of the CMP polishing, the polishing can be performed by using a polishing liquid containing an abrasive component such as silica, alumina, and ceria. In addition, a plurality of polishing liquids may be used together, or may be used sequentially. After the polishing, the polishing chips and the excess abrasives may be removed with a washing liquid such as pure water and a solvent.

When the electroless plating that is the next step is performed, in order to facilitate the adsorption of the palladium onto the seed layer and the copper layer 10, the copper layer 12, the seed layer and the palladium adsorption layer above the first resin layer region 4, and the first resin layer region 4 are removed, and then, the exposed surface of the seed layer and the copper layers 10 and 11 may be chemically or physically roughened.

<Step of Performing Cap Plating>

Next, in a case where the forming of the wiring layer is ended, as illustrated in FIG. 2(*c*), cap platings 14 and 15 may be formed by the electroless plating on the exposed seed layer, copper layers 10 and 11 (wiring layer 13), and palladium adsorption layer. As the metal type of the cap platings 14 and 15, a metal including any one type of Cu, Ni, Cr, and W may be used. As described above, a wiring board 20 including the fine wiring layer 13 is fabricated.

<Method for Manufacturing Semiconductor Device>

Figure 3:
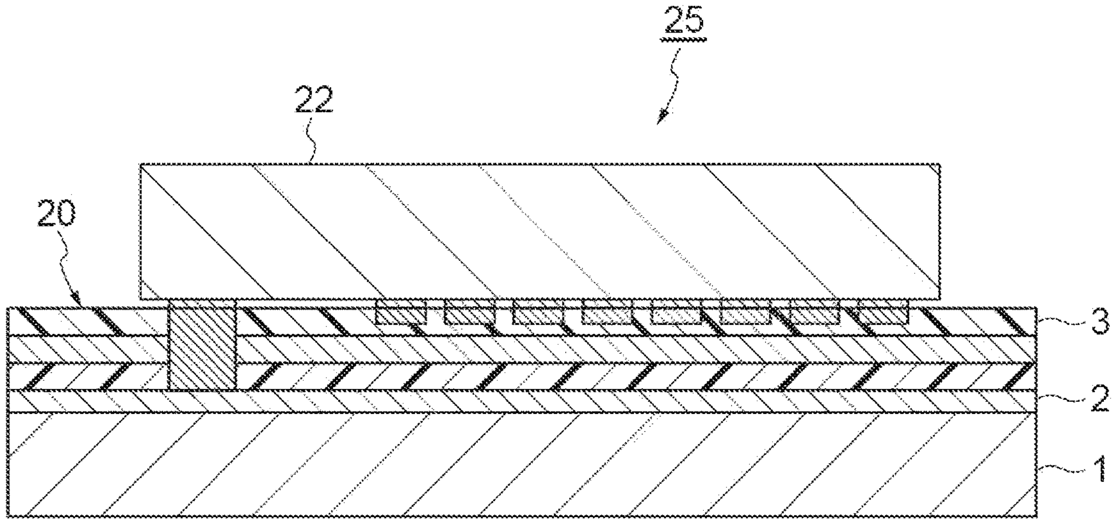
FIG. 3 is a diagram illustrating an example of a semiconductor device in which a semiconductor element is mounted on the wiring board manufactured by the manufacturing method illustrated in FIG. 1 and FIG. 2.

Next, as illustrated in FIG. 3, the semiconductor element 22 is mounted on the wiring layer 13 on the wiring board 20, and the connection terminals of the semiconductor element 22 are electrically connected to the wiring layer 13. Accordingly, a semiconductor device 25 connected by the fine wiring layer 13 is fabricated.

As described above, in the method for manufacturing a wiring board and a semiconductor device according to this embodiment, the resin sheet 3 having the glass cloth arranged in the organic resin is used, the recesses 7 are formed by the excimer laser in the first resin layer region 4 in which the glass cloth does not exist in the resin sheet 3, and the wiring layer 13 is formed in the recesses 7 and the like. In this case, the fine processing of the recesses 7 can be performed by the laser, and the fine wiring layer can be easily formed.

In the method for manufacturing a wiring board and a semiconductor device according to this embodiment, the thickness of the first resin layer region 4 on the surface side of the resin sheet 3 may be 20 μm or less. In this case, the layer region for forming the fine wiring layer 13 can be thinned, and the height of the wiring board 20 to be manufactured can be reduced. In addition, in this manufacturing method, the thickness of the first resin layer region 4 may be 5 μm or more. Accordingly, the recesses 7 with a suitable depth can be formed, and the fine wiring layer 13 excellent in the conductivity can be formed.

In the method for manufacturing a wiring board and a semiconductor device according to this embodiment, each line width of the recesses 7 formed in the first resin layer region 4 may be 0.5 μm or more and 5 μm or less. In this case, the fine wiring layer 13 excellent in the conductivity can be formed.

In the method for manufacturing a wiring board and a semiconductor device according to this embodiment, the resin sheet 3 includes the second resin layer region 6 opposite to the first resin layer region 4, and in the preparing of the structure body, the structure body 1*a* is prepared by sticking the resin sheet 3 onto the support body 1 with the second resin layer region 6. In this case, the structure body 1*a* can be prepared by a simple method such as lamination, and the manufacturing method can be simplified.

In the method for manufacturing a wiring board and a semiconductor device according to this embodiment, the forming of the plating layer includes the performing of the desmear treatment with respect to the recesses 7 and the opening portion 8, and the surface of the first resin layer region, the performing of the electroless plating with respect to the recesses 7 and the opening portion 8, and the surface of the first resin layer region to form the seed layer 9, the performing of the electrolytic plating on the seed layer 9 to form the copper layers 10 to 12; and the removing of the seed layer 9 and the copper layers 10 to 12 on the surface of the first resin layer region 4 to planarize the surface of the first resin layer region 4, the seed layer 9, and the copper layers 10 to 12. Accordingly, the conductive portions of the fine wiring layer 13 can be more accurately formed.

In the method for manufacturing a semiconductor device according to this embodiment, according to various methods described above, the semiconductor device 25 including the wiring board 20 provided with the fine wiring layer 13 can be fabricated by a simplified method. In addition, since the semiconductor device is fabricated by the simplified method, it is also possible to attain improvement in a manufacturing yield ratio, a cost reduction in manufactured goods, or the like. Further, the present invention is not limited thereto, and in the case of mounting a plurality of semiconductor elements (chips) (in particular, in the case of performing high-density mounting), the semiconductor elements can be connected by the fine wiring layer excellent in transmission properties, and a small semiconductor device with more excellent performance can be provided.

The resin sheet 3 according to this embodiment includes the first resin layer region 4 positioned outside and the high elasticity layer region 5 positioned inside with the elastic modulus higher than that of the first resin layer region 4. By fabricating such a resin sheet 3 in advance, it is possible to further simplify the method for manufacturing a wiring board and the method for manufacturing a semiconductor device described above, and to attain the improvement in the yield ratio of the wiring board 20 and the semiconductor device 25 to be manufactured, the cost reduction in the manufactured goods, or the like.

The resin sheet 3 according to this embodiment further includes the second resin layer region 6 positioned opposite to the first resin layer region 4 through the high elasticity layer region 5, and the second resin layer region 6 has the adhesiveness. Accordingly, it is possible to more easily form the structure body 1*a* including the resin sheet 3, and to further simplify the method for manufacturing the wiring board 20 and the method for manufacturing the semiconductor device 25 described above.

As described above, the embodiment of the present invention has been described in detail, but the present invention is not limited to the embodiment described above, and can be applied to various embodiments. For example, in the embodiment described above, as illustrated in FIG. 1 to FIG. 3, one wiring layer 13 is provided, and the semiconductor element 22 is arranged thereon to fabricate the semiconductor device 25, but two or more wiring layers 13 may be provided. In this case, after the forming of the wiring layer 13 illustrated in FIG. 2(*b*) is performed, pasting another resin sheet 3 onto the first resin layer region 4 on which the wiring layer 13 is formed to be attached, forming another recesses 7 in a first resin layer region 4 of the another resin sheet 3, forming another opening portion 8 in the another resin sheet 3, and forming another wiring layer 13 in the another recesses 7 and the another opening portion 8 may be further repeated once or more to multi-layer the wiring layers 13. When the multi-layering is performed, the another opening portion 8 is formed to reach the copper layer 11 or the wiring layer 13 of the inside opening portion 8 from the surface side of the another resin sheet 3. Accordingly, it is possible to obtain the wiring board and the semiconductor device in which the fine wiring layers 13 are multi-layered.

Figure 4:
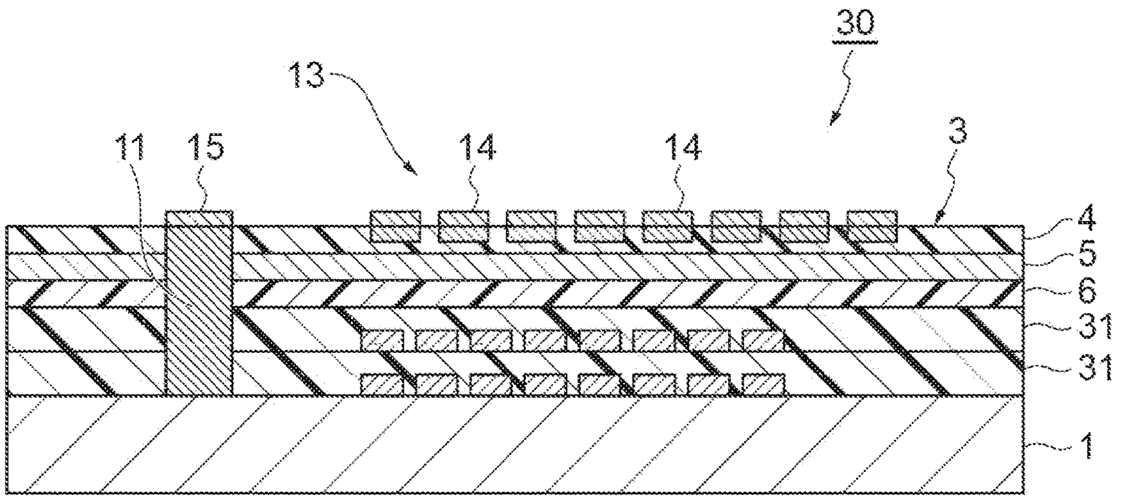
FIG. 4(*a*) is a diagram illustrating a wiring board according to a modification example, and FIG. 4(*b*) is a diagram illustrating a semiconductor device according to a modification example.
Figure 4:
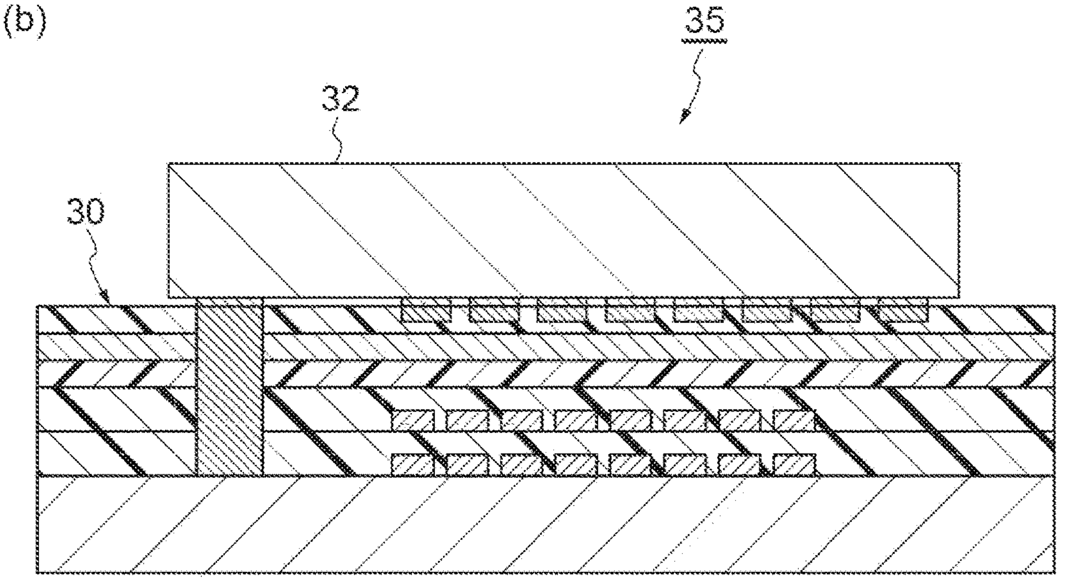

In addition, as illustrated in FIG. 4(*a*), one or more built-in wiring layers 31 may be provided on the support body 1 to form a built-in wiring portion, the resin sheet 3 may be stuck thereon to be attached, and the forming of the recesses 7, the forming of the opening portion 8, and the forming of the wiring layer 13 may be performed to form a multi-layered wiring board 30. Then, as illustrated in FIG. 4(*b*), a semiconductor element 32 may be mounted on the multi-layered wiring board 30 to form a semiconductor device 35. In this case, the built-in wiring layers 31 can be formed by using a buildup method. Accordingly, the built-in wiring layers 31 can be multi-layered by using a related method, and only the wiring layer 13 on the surface layer (that is, a connection portions with the semiconductor element) can also be a finer wiring layer. In this case, for example, it is possible to fabricate the wiring board having an optimum configuration by using different materials such that the built-in wiring layer 31 is formed from a buildup material, and the fine wiring layer 13 on the surface is formed by performing laser processing with respect to an organic resin material such as a prepreg to form recesses. In addition, according to such a manufacturing method according to a modification example, it is also possible to increase the degree of freedom in design of the wiring board.

REFERENCE SIGNS LIST

1: support body, la: structure body, 2: copper layer (metal layer), 3: resin sheet, 4: first resin layer region, 5: high elasticity layer region, 6: second resin layer region, 7: recess, 8: opening portion, 9: seed layer, 10, 11: copper layer (plated metal layer, second portion), 12: copper layer (first portion), 13: wiring layer, 14, 15: cap plating, 20: wiring board, 22: semiconductor element, 25: semiconductor device, 30: wiring board, 31: built-in wiring layer, 32: semiconductor element, 35: semiconductor device.

The invention claimed is:

1. A method for manufacturing a wiring board, comprising:

preparing a structure body in which a resin sheet having a glass cloth arranged in an organic resin is attached onto a support body having a metal layer provided on a surface thereof or onto a built-in wiring layer provided on the support body;

forming a recess by excimer laser in a first resin layer region in which the glass cloth does not exist on a surface side of the resin sheet;

forming an opening portion reaching the metal layer on the support body from the surface of the resin sheet; and forming a wiring layer in the recess and the opening portion.

2. A method for manufacturing a wiring board, comprising:

preparing a structure body in which a resin sheet sequentially including a first resin layer region positioned outside and a high elasticity layer region positioned inside with an elastic modulus higher than that of the first resin layer region is attached onto a support body having a metal layer provided on a surface thereof or onto a built-in wiring layer provided on the support body;

forming a recess by laser or imprinting in the first resin layer region on a surface side of the resin sheet, wherein the recess is formed so as not to reach the high elasticity layer region;

forming an opening portion reaching the metal layer on the support body from the surface of the resin sheet; and forming a wiring layer in the recess and the opening portion.

3. The method for manufacturing a wiring board according to claim 2, wherein the high elasticity layer region is formed by arranging at least one of an inorganic fiber and an organic fiber in an organic resin material.

4. The method for manufacturing a wiring board according to claim 3, wherein the inorganic fiber is at least one of a glass fiber, a ceramic fiber, and a carbon fiber, and the organic fiber is at least one of an aramid fiber and a polyethylene fiber.

5. The method for manufacturing a wiring board according to claim 1, wherein a thickness of the first resin layer region on the surface side of the resin sheet is 5 μm or more and 20 μm or less.

6. The method for manufacturing a wiring board according to claim 1, wherein a line width of the recess formed in the first resin layer region is 0.5 μm or more and 5 μm or less.

7. The method for manufacturing a wiring board according to claim 1, wherein the resin sheet includes a second resin layer region opposite to the first resin layer region, and wherein, in the preparing of the structure body, the structure body is prepared by sticking the resin sheet onto the support body or onto the built-in wiring layer with the second resin layer region.

8. The method for manufacturing a wiring board according to claim 1, wherein when the recess is formed by the excimer laser in the first resin layer region, a pulse width of the excimer laser is 10 nanoseconds or longer and 50 nanoseconds or shorter, and output of the excimer laser is 10 mJ/pulse or more and 1000 mJ/pulse or less.

9. The method for manufacturing a wiring board according to claim 1, wherein, in the forming of the wiring layer, the wiring layer is formed by forming a plated metal layer in the recess and the opening portion, and wherein the resin sheet contains a component having a heterocyclic aromatic nucleus capable of performing a coordinate bond with respect to a metal material configuring a seed layer for forming the plated metal layer.

10. The method for manufacturing a wiring board according to claim 1, wherein the resin sheet or a covering layer covering the resin sheet contains a laser light absorptive coloring component including at least one of an inorganic colorant, an inorganic pigment, an organic colorant, and an organic pigment.

11. The method for manufacturing a wiring board according to claim 1, wherein, in the forming of the wiring layer, the wiring layer is formed by providing the seed layer in the recess and the opening portion with electroless plating to form the plated metal layer, and the resin sheet contains a catalyst to form the electroless plating.

12. The method for manufacturing a wiring board according to claim 1, wherein the forming of the wiring layer, includes:

filling the recess and the opening portion with a conductive material and providing the conductive material on a surface of the first resin layer region excluding the recess and the opening portion to form a conductive layer; and planarizing the conductive layer, and wherein, in the planarizing, a first portion of the conductive layer provided on the surface of the first resin layer region is at least polished, and the wiring layer is formed from a second portion of the conductive layer formed from the conductive material filled in the recess and the opening portion.

13. The method for manufacturing a wiring board according to claim 1, further comprising forming a built-in wiring portion including at least one built-in wiring layer on the support body, wherein in the preparing of the structure body, the structure body is prepared by sticking the resin sheet onto the built-in wiring portion to be attached.

14. The method for manufacturing a wiring board according to claim 1, further comprising:

attaching another resin sheet onto the resin sheet on which the wiring layer is formed;

forming another recess by the laser in a first resin layer region of the another resin sheet;

forming another opening portion reaching the plated metal layer or the wiring layer in the opening portion from a surface of the another resin sheet; and forming another plated metal layer in the another recess and the another opening portion to form another wiring layer, wherein, the attaching of the another resin sheet, the forming of the another recess, the forming of the another opening portion, and the forming of the another wiring layer are repeated at least once or more.

15. The method for manufacturing a wiring board according to claim 1, wherein the forming of the wiring layer, includes:

performing a desmear treatment with respect to at least the opening portion and the recess;

performing the electroless plating with respect to at least the opening portion and the recess to form the seed layer;

performing electrolytic plating on the seed layer to form the plated metal layer; and removing the seed layer and the plated metal layer on the surface of the first resin layer region to planarize the surface of the first resin layer region, the seed layer, and the plated metal layer.

16. A method for manufacturing a semiconductor device, comprising:

preparing a wiring board manufactured by the method for manufacturing a wiring board according to claim 1; and mounting a semiconductor element on the wiring layer or the another wiring layer to electrically connect the semiconductor element to the wiring layer or the another wiring layer.

17. A semiconductor device having a structure manufactured by using the method for manufacturing a semiconductor device according to claim 16.

18. The method for manufacturing a wiring board according to claim 2, wherein a depth of the recess is less than a thickness of the first resin layer region.

19. The method for manufacturing a wiring board according to claim 1, wherein the recess is formed so as not to reach a region in which the glass cloth exists.

* * * * *